United States Patent [19]

Conner

[11] Patent Number: 4,561,111
[45] Date of Patent: Dec. 24, 1985

[54] METHOD OF PREDISTORTING A SINGLE SIDEBAND SYSTEM

[75] Inventor: William A. Conner, Plano, Tex.

[73] Assignee: Rockwell International Corporation, El Segundo, Calif.

[21] Appl. No.: 638,093

[22] Filed: Aug. 6, 1984

[51] Int. Cl.[4] .................... H04B 15/00; H04B 17/00
[52] U.S. Cl. .......................... 455/63; 455/47; 455/67; 455/69
[58] Field of Search ............. 455/47, 52, 63, 67, 455/69; 179/175.3 R; 324/57 N

[56] References Cited

U.S. PATENT DOCUMENTS

| | | | |
|---|---|---|---|
| 2,924,703 | 2/1960 | Sichak et al. | 455/69 |
| 3,195,047 | 7/1965 | Ruthroff | 455/69 |
| 3,271,679 | 9/1966 | Fostoff | 455/69 |
| 3,434,056 | 3/1969 | Becker | 455/67 |
| 3,467,866 | 9/1969 | Palatinus | 455/67 |
| 4,088,948 | 5/1978 | Miedema | 455/67 |

FOREIGN PATENT DOCUMENTS 2638591  3/1978  Fed. Rep. of Germany ........ 455/47

OTHER PUBLICATIONS

"Realization of Predistortion Compensators of Memoryless Nonlinear Devices"–Vuong et al, 8–12 June 1980, Int'l. Conf. on Communications 1980, pp. 33.7.1–33.7.5.
"Predistortion Nonlinear Compensator for Microwave SSB-AM System"–Nojima et al, 8–12 June 1980, Int'l. Conf. on Communications 1980, pp. 33.2.1–33.2.6.

Primary Examiner—Marc E. Bookbinder
Attorney, Agent, or Firm—V. Lawrence Sewell; H. Fredrick Hamann

[57] ABSTRACT

A method of predistortion alignment of a single sideband transmission system in which the receiver becomes a part of the signal path which is predistorted, to providing improved overall intermodulation distortion. A convenient method of performing the alignment under field conditions is disclosed.

2 Claims, 5 Drawing Figures

PRIOR ART

METHOD OF PREDISTORTING A SINGLE SIDEBAND SYSTEM

BACKGROUND OF THE INVENTION

This invention relates to a method for improving the intermodulation distortion performance of a single sideband system by predistortion.

The traveling wave tube amplifiers normally used in microwave single sideband amplitude modulated transmitters have significant nonlinearities which introduce intermodulation distortion. In order for the transmitter exhibit greater linearity than the traveling wave tube amplifier, the transmitter can include a "predistortion" circuit which introduces a nonlinearity that is the inverse of that in the traveling wave tube amplifier.

Conventionally, predistortion is not used in receivers, because they can be made linear over a useful power range without it. If a receiver receives more power than it can handle linearly, attenuators can be used to reduce the power. Unfortunately, this reduces the fade margin as well.

In aligning a transmitter in the laboratory or factory using predistortion, radio frequency power from the transmitter is coupled to an associated receiver at a power level that is reduced sufficiently that the receiver makes negligible contribution to intermodulation distortion in the signal path. The intermediate frequency output of the receiver operating in this condition is monitored for intermodulation distortion, while the predistortion circuit nonlinearity is adjusted.

Predistortion alignment of the transmitter in the field transmitting to a distant site is more difficult. An example arrangement for performing such an alignment is shown in FIG. 1. A coupler 10 samples the radio frequency output from the transmitter 12 under test. The level of the signal from coupler 10 is reduced by attenuator 14 to a sufficiently low level that test downconverter 16 will not introduce significant intermodulation distortion. A reject filter 18 removes intermodulation distortion-producing test tones before monitoring of the downconverted intermediate frequency signal by a test set 20. Precautions must be taken to ensure that no frequency errors occur during the translation by downconverter 16. As shown in FIG. 1, local oscillators 22 and 23 of the transmitter 12 and downconverter 16, respectively, are locked to the output of a common reference frequency source 26. Another method employed is to sample the transmitter local oscillator to drive the test downconverter.

SUMMARY OF THE INVENTION

In accordance with the present invention, there is provided a method of predistortion alignment of a single sideband transmission system in which the receiver is a part of the signal path which is predistorted.

The present invention is in contrast to prior practices, in which the effort is made not to involve the receiver, and certain aspects of the prior art alignment methods are directed to this result. Once it has been conceived as possibly advantageous to include the receiver in the predistorted path, the question remains how can such a predistorted path be aligned conveniently under field conditions, in which the transmitter is located at one station and the receiver is located at another, distant station.

The present invention provides a convenient and effective method of predistortion alignment of single sideband systems in the field. Test tones having the capability of producing intermodulation distortion are applied by way of a predistortion circuit to a first transmitter at a first site. At a second distant site, radio frequency output from the transmitter is applied at the received power level to a first receiver. Some of the test tones in the intermediate frequency output of the receiver are filtered to remove the intermodulation distortion producing capability of the tones, and the filtered output is applied to a second transmitter at the second site. A second receiver back at the first site receives the radio frequency output of the second transmitter. The intermediate frequency output of the receiver at the second site is monitored for intermodulation distortion, while the predistortion circuit is adjusted to minimize the monitored distortion.

Including the receiver in the signal path which is predistorted improves the intermodulation distortion of the path, since the predistortion compensates not only for the significant nonlinearity of the traveling wave tube amplifier in the transmitter, but also nonlinearities in the receiver which are small, but measurable, at normal received levels but can be very significant at high received levels. As a result, fade margin does not have to be sacrificed when the receiver encounters a high level signal.

DESCRIPTION OF PREFERRED EMBODIMENT

Figure 1:
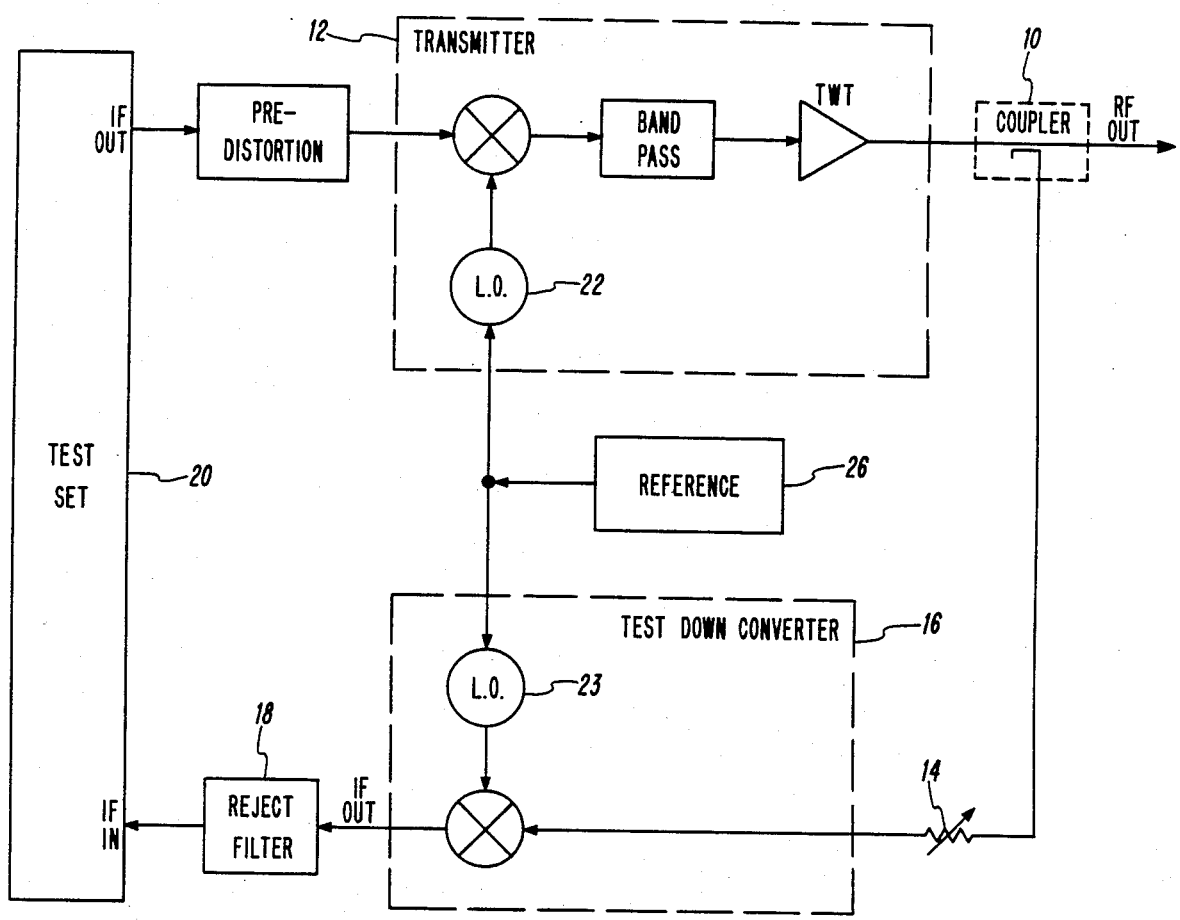
FIG. 1 is a block diagram of a test system for predistortion alignment of a transmitter in accordance with the prior art.
Figure 2A:
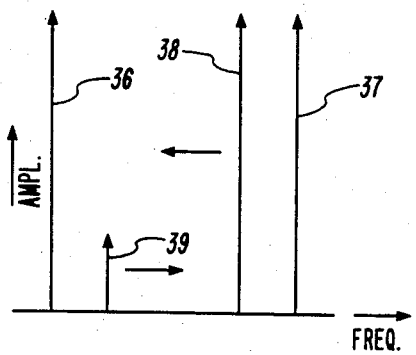
FIGS. 2A and 2B are plots of amplitude versus frequency illustrating the filtering of test tones as a part of the method of the invention.
Figure 3:
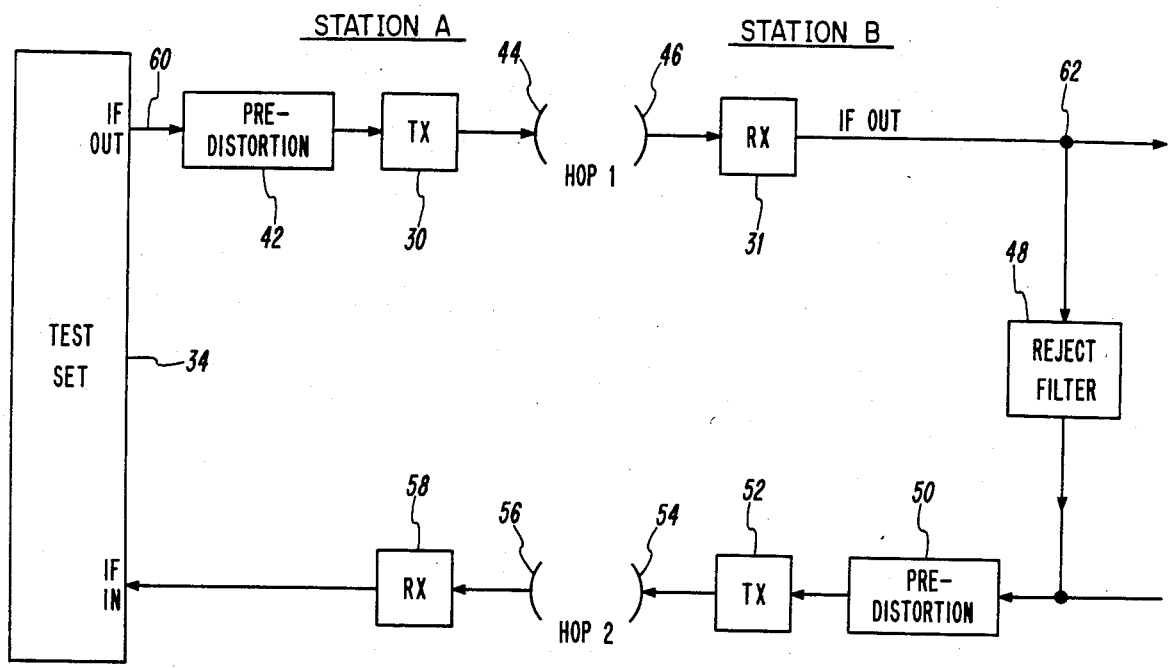
FIG. 3 is a block diagram of a system configuration for predistortion alignment in the field, in accordance with the invention.

FIG. 3 illustrates the implementation of the invention in predistorting in the field a transmitter 30 at Station A and receiver 31 at distant Station B. A test set 34 of the kind used in prior art predistortion alignment can be, for example, a model SBG-1 manufactured by Wandel & Golterman. It provides intermediate frequency test tones illustrated in FIG. 2A. The test tones consist of fixed frequency tones 36 and 37 and a swept frequency tone 38. Nonlinearities in the system to which the tones are applied result in intermodulation distortion in the form of a tone such as tone 39 sweeping in a direction opposite to tone 38. The test tones are applied by way of predistortion circuit 42 to transmitter 30.

The radio frequency output of transmitter 30 is transmitted by antenna 44 "over-the-hop" from Station A to Station B. The radio frequency signal acquired by antenna 46 is applied to receiver 31 at the received power level.

Figure 2B:
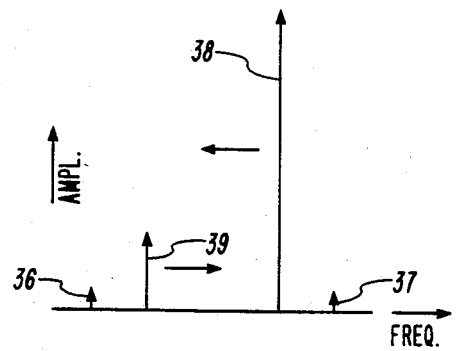

The intermediate frequency output of receiver 31 is filtered by reject filter 48. The effect of filter 48 is shown in FIG. 2B. Fixed frequency tones 36 and 37 are attenuated as much as possible. In the absence of tones 36 and 37, sweeping tone 38 will not give rise to substantial intermodulation distortion in the signal path which follows.

The output of reject filter 48 is applied by way of predistortion circuit 50 to a second transmitter 52, at Station B. The radio frequency output of transmitter 52 is transmitted on antenna 54 over-the-hop to antenna 56 of Station A. The signal from antenna 56 is applied to receiver 58, and the intermediate frequency output of receiver 58 is applied to the input of test set 34 for monitoring the intermodulation distortion from the receiver. Predistortion circuit 42 is adjusted to minimize the intermodulation distortion monitored in the intermediate frequency output of receiver 58.

The signal path including predistortion circuit 50, transmitter 52 and receiver 58 does not need to be particularly linear. This is because the reject filter 48, having removed the fixed test tones 36 and 37 has eliminated or substantially reduced the capability to generate intermodulation distortion in that signal path of the kind that would be measured by test set 34 as a part of intermodulation distortion 39 (FIG. 2B). It is also a factor that the alignment procedure is seeking to minimize the intermodulation distortion received at test set, 34 not to measure the absolute magnitude of it. For those reasons, predistortion circuit 50 does not need to be optimally adjusted in order for the technique to result in a proper adjustment of predistortion circuit 42.

From a performance standpoint, the linearity of the transmission system in FIG. 3 from point 60 to point 62 is improved by the alignment method of the invention, because the predistortion circuit 42 compensates for nonlinearities in receiver 31 as well as those of transmitter 30. If the receiver receives a high power signal (in the range in which the receiver response becomes significantly nonlinear), the predistortion process eliminates the need for attenuating the signal and thereby reducing fade margin.

The alignment method described is performed under field conditions, as for example, in the initial installation of radios at Stations A and B, but it is basically very convenient. Once reject filter 48 is connected, the technician activity, of adjusting predistortion circuit 42 and observation of monitored intermodulation distortion with test set 34, all takes place at station A.

It will be apparent to those skilled in the art that once the system comprising transmitter 30 and receiver 31 is aligned, then the test set 34 can be taken to Station B to align the system comprising predistortion circuit 50, transmitter 52 and receiver 58. The output of receiver 58 can be connected to the input of predistortion circuit 42 directly, relying on the linearity of the transmission system operating over Hop 1. Preferably, reject filter 48 can be used to interconnect receiver 58 and predistortion circuit 42 to further prevent the introduction of intermodulation distortion by the system including transmitter 30 and receiver 31.

Figure 4:
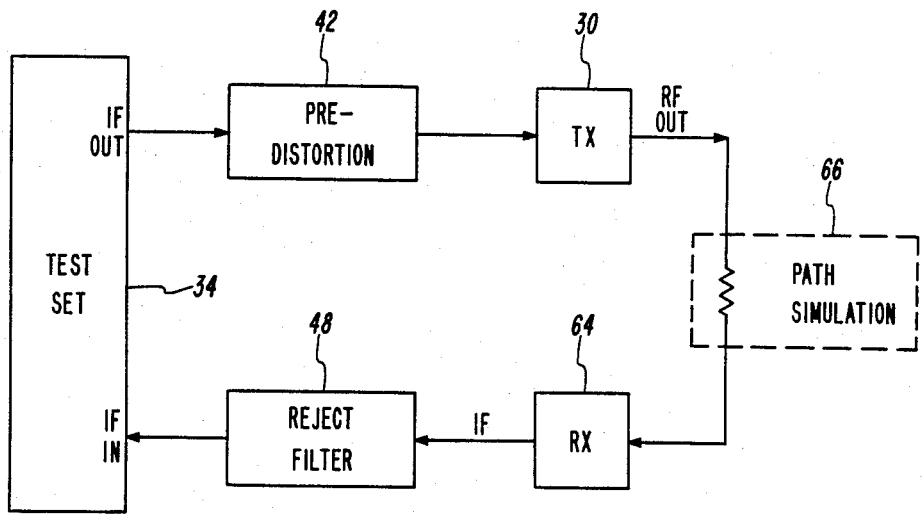
FIG. 4 ls a block diagram of a system for predistortion alignment in accordance with the present invention, suitable for a laboratory of factory. de

FIG. 4 shows an arrangement for applying the principles of the invention in a laboratory or factory environment. In that figure, a transmitter 30 and receiver 64 are to be predistorted. Instead of transmitting the radio frequency output of transmitter 30 to a distant station, the output is fed by way of an attenuator 66 to receiver 64. The attenuator 66 attenuates the radio frequency signal only enough to simulate an ordinary radio transmission path, applying the signal to the input of receiver 64 at a power level at least as high as those experienced in a practical radio transmission environment. Reject filter 48 eliminates the fixed frequency test tones as before, in order to eliminate the generation of intermodulation distortion in test set 34. As before, predistortion circuit 42 is adjusted to minimize the intermodulation distortion observed at intermediate frequencies by test set 34.

The method illustrated by FIG. 4 differs from prior art methods in that the radio frequency power applied to receiver 64 is at normal operating levels or higher and therefore the receiver 64 is a part of the transmission system which is predistorted by circuit 42. As with the over-the-hop alignment, total intermodulation distortion in the transmission path including transmitter 30 and receiver 64 is thereby reduced.

I claim:

1. A method of aligning a single sideband transmission system having a receiver and having a transmitter responsive to a predistortion circuit, comprising:

applying as an input to said predistortion circuit selected multiple test tones having the capability of producing intermodulation distortion, applying a radio frequency output of said transmitter to the input of said receiver at power levels at least as high as those experienced in a practical radio transmission environment, filtering selected ones of said test tones present in an intermediate frequency output of said receiver to remove the intermodulation distortion producing capability thereof, monitoring the intermodulation distortion present in the filtered intermediate frequency output of said receiver, and adjusting said predistortion circuit to minimize the monitored intermodulation distortion, whereby the system, including both the transmitter and receiver is appropriately predistorted.

2. The method of claim 1, wherein said step of applying an output of the transmitter to the input of the receiver includes transmitting from a first station and receiving at a distant second station, and said monitoring includes transmitting a signal including information of said filtered intermediate frequency output from said second station and receiving said signal at said first station.

* * * * *